United States Patent [19]
Terasawa

[11] Patent Number: 5,894,140
[45] Date of Patent: *Apr. 13, 1999

[54] SEMICONDUCTOR DEVICE HAVING RECESSED GATE STRUCTURES AND METHOD OF MANUFACTURING THE SAME

[75] Inventor: Yoshio Terasawa, Katsuta City, Japan

[73] Assignee: NGK Insulators, Ltd., Japan

[*] Notice: This patent is subject to a terminal disclaimer.

[21] Appl. No.: 08/483,589

[22] Filed: Jun. 7, 1995

[30] Foreign Application Priority Data

Jun. 9, 1994 [JP] Japan ................................ 6-127676
Apr. 6, 1995 [JP] Japan ................................ 7-081190

[51] Int. Cl.$^6$ ............................ H01L 29/74; H01L 31/111
[52] U.S. Cl. ................................... 257/147; 257/138
[58] Field of Search .......................... 257/119, 138, 257/147, 151, 153

[56] References Cited

U.S. PATENT DOCUMENTS

| | | | |
|---|---|---|---|
| 4,654,679 | 3/1987 | Muraoka | 357/22 |
| 5,089,431 | 2/1992 | Slatter et al. | 437/39 |
| 5,153,695 | 10/1992 | Gobrecht et al. | 257/153 |
| 5,461,242 | 10/1995 | Muraoka et al. | 257/153 |
| 5,591,991 | 1/1997 | Terasawa | 257/137 |
| 5,602,405 | 2/1997 | Terasawa | 257/136 |
| 5,648,665 | 7/1997 | Terasawa | 257/136 |

FOREIGN PATENT DOCUMENTS

| | | |
|---|---|---|
| 0 425 037 A2 | 5/1991 | European Pat. Off. . |
| 0 425 037 A3 | 5/1991 | European Pat. Off. . |
| 0 476 296 A1 | 3/1992 | European Pat. Off. . |
| 0 680 093 A2 | 11/1995 | European Pat. Off. . |
| 0 680 093 A3 | 11/1995 | European Pat. Off. . |
| 32 42 736 A1 | 5/1983 | Germany . |
| 0120588 | 9/1979 | Japan ................................ 257/138 |
| 7-45815 | 2/1995 | Japan . |

OTHER PUBLICATIONS

Patent Abstracts of Japan, vol. 11, No. 7 (E–469), Jan. 9, 1987 & JP 61 182260 A (Toshiba), Aug. 14, 1986, *abstract*.

Mitlehner et al., "A Novel 8 KV Light–Triggered Thyristor With Overvoltage Self Protection," 1990, pp. 289–294.

Baliga, "Modern Power Devices," 1987, pp. 350–353.

Amato et al., "Comparison of Lateral and Vertical DMOS Specific On–Resistance," 1985, pp. 736–739.

Adler et al., "The Evolution of Power Device Technology," 1984, pp. 1570–1591.

Ishidoh et al., "Advanced High Frequency GTO," 1988, pp. 189–194.

Nishizawa et al., "Analysis of Characteristic of Static Induction Thyristor," 1981, pp. 31–38.

Nishizawa et al., "Effects of Gate Structure on Static Induction Thyristor," 1980, pp. 658–661.

Nishizawa et al., "Static Induction Thyristor," 1978, pp. 725–728.

Nishizawa et al., "Field–Effect Transistor Versus Analog Transistor (Static Induction Transistor)," 1975, pp. 185–197.

Nikkei Electronics, 1971, pp. 50–61.

*Primary Examiner*—Olik Chaudhuri
*Assistant Examiner*—Howard Weiss
*Attorney, Agent, or Firm*—Parkhurst & Wendel

[57] ABSTRACT

A gate structure including semiconductor regions each having a high impurity-concentration and being formed within respective one of recessed portions provided in a surface of a first semiconductor substrate, and then a second semiconductor substrate is brought into contact with the surface of the first semiconductor substrate. The gate structure may be formed such that each of the recessed portions is completely or partially filled with the gate structure. When the gate structure includes electrically good-conductive films of a high melting point metal or the like each formed in respective one of the recessed portions, the gate resistance can be further decreased.

14 Claims, 10 Drawing Sheets

FIG_1

FIG_2

FIG_3

FIG_4

FIG_7

SEMICONDUCTOR DEVICE HAVING RECESSED GATE STRUCTURES AND METHOD OF MANUFACTURING THE SAME

BACKGROUND OF THE INVENTION

1. Field of the Invention

The present invention relates to a semiconductor device and a method of manufacturing the same, and more particularly to a self-extinguishing type semiconductor device such as a GTO (gate turn-off) thyristor, an SI (static induction) thyristor, and an IGBT (Insulated Gate Bipolar Transistor) power transistor, and to a method of manufacturing such a self-extinguishing type semiconductor device.

2. Description of the Related Art

A self-extinguishing type semiconductor device such as GTO thyristor, SI thyristor or IGBT has been widely used as a power semiconductor device and has been described in the following documents.

1. Junichi Nishizawa: "Development of High Power Static Induction Transistor", Report on Researches subsidized by Agency of Industrial Science & Technology of MITI (1969)
2. Junichi Nishizawa: "High Power Vertical Type Junction FET having Triode Characteristics", Nikkei Electronics, Sep. 27, 1971, pp. 50–61
3. J. Nishizawa, T. Terasaki and J. Shibata: "Field-Effect Transistor versus Analog Transistor (Static Induction Transistor)", IEEE Trans. on Electron Device, ED-22(4), 185 (1975)
4. J. Nishizawa and K. Nakamura: Physiquee Appliquée, T13, 725 (1978)
5. J. Nishizawa and Y. Otsubo: Tech. Dig. 1980 IEDM, 658 (1980)
6. J. Nishizawa, T. Ohmi, T. Sha and K. Mototani; Technological Report of the Electron and Communication Society, ED81-84 (1981)
7. M. Ishidoh, et al: "Advanced High Frequency GTO", Proc. ISPSD, 189 (1988)
8. B. J. Baliga, et al: "The Evolution of Power Device Technology", IEEE Trans. on Electron Device, ED-31, 1570 (1984)
9. M. Amato, et al: "Comparison of Lateral and Vertical DMOS Specific On-resistance", IEDM Tech. Dig., 736 (1985)
10. M. S. Adler: "Modern Power Device", John Wiley Sons, 350 (1987)
11. H. Mitlehner, et al: "A Novel 8 kV Light-Trigger Thyristor with Over Voltage Self Protection", Proc. ISPSD, 289 (1990)

Among the conventional self-extinguishing types of semiconductor devices, the GTO thyristor and SI thyristor are known to have an embedded gate-type structure which can be obtained by forming a gate region in a surface of a semiconductor substrate and then providing an epitaxial layer on that surface. In such GTO thyristors and SI thyristors, since the epitaxial growth has a substrate dependency, the epitaxial layer formed on the surface of the semiconductor substrate, in which the gate region is provided in advance, has such defects that crystals grown on the gate region are different from those on the other portions, and that a uniform impurity-concentration distribution is not obtained. As a result, it has been difficult to obtain a semiconductor device having good characteristics. In addition, since the epitaxial growth is a relatively time-consuming process, it lowers the throughput of the semiconductor device. Furthermore, there is still another problem that the conductivity type of the epitaxial layer in a vicinity of the gate region is likely to be inverted. To solve these problems, a surface gate-type structure has been proposed. However, an SI thyristor having this surface gate-type structure cannot have a large reverse voltage and thus, it fails to have a large depletion layer. Accordingly, the SI thyristor with this structure cannot cut off a large current.

When the surface gate-type structure is utilized in a GTO thyristor, there is a further problem, in addition to those mentioned in the case of SI thyristors, in that the gate region cannot have a high impurity-concentration. This results in a low carrier drawing speed and greater turn-off loss and thus, a high frequency property cannot be obtained in the GTO thyristor with this structure.

With respect to an IGBT, it has been known that a cathode and a gate are usually formed on the same surface of a semiconductor substrate. Accordingly, it is not possible for the IGBT to have a cathode covering the entire surface of a semiconductor substrate, because a gate must also be formed in the same surface of the semiconductor substrate. As a result, the IGBT involves problems in that the total cathode area is small and cathode electrode wiring is not easily constituted by a single metal film. This also means that the device cannot be cooled at both surfaces thereof. Because of these problems, the IGBT having the surface gate structure cannot sustain a large electric current.

As a solution for these problems, there has been proposed a serrated gate-type structure. This structure is constituted by forming a groove on a surface of a semiconductor substrate and then, providing a gate region in a bottom portion of the groove. However, it is difficult to accurately form a deep groove by dry etching, and this leads to poor breakdown voltage. It is also difficult to conduct precise machining in this serrated gate-type structure.

As another solution for the above-mentioned problems, the present applicant has proposed, in U.S. patent application Ser. No. 08/407,023 as well as corresponding European Patent Application No. 94 921826.7, a manufacturing method of a semiconductor device comprising the steps of forming recesses or depressions in a surface of a first semiconductor substrate of one conductivity type, forming gate regions of the opposite conductivity type at bottoms of the recesses by introducing impurities from the bottoms of the recesses, providing gate electrodes on the respective gate regions, and joining a second semiconductor substrate to the surface of the first semiconductor substrate. Semiconductor devices having this joined or contacted structure are free from various problems caused by epitaxial growth. Specifically, in a GTO thyristor, since a gate region can include impurities at a high concentration without any difficulty, the carrier drawing speed can be increased correspondingly and thus, the high frequency property can be attained easily. In an SI thyristor, since gate regions having a high impurity-concentration can be uniformly embedded within a semiconductor substrate, the resulting thyristor includes large total gate region area. With respect to an IGBT having this contacted structure, the cooling efficiency is greatly improved because this structure enables the IGBT to have a cathode covering the entire surface of a semiconductor substrate. As a result, the IGBT with this joined structure can sustain a flow of large electric current.

These semiconductor devices having the above-described joined structure can be produced by simpler manufacturing process, but the characteristics of the device are not improved very much when compared with the conventional semiconductor devices having the embedded gate-type structure, for which epitaxial growth is utilized, or those having the serrated gate-type structure. Namely, even in the semiconductor device having the joined structure, the electric current flowing within a channel cannot be cut off more completely without greatly decreasing the gate resistance.

In addition, since a hollow space is formed above the gate region in the joined structure-type semiconductor device, the device may sometimes fail to have a sufficient mechanical strength, and the gate region is likely to be contaminated with undesired impurities, which may cause a deterioration in the device properties. The hollow space also decreases the cooling efficiency of the device.

SUMMARY OF THE INVENTION

Accordingly, an object of the present invention is to mitigate the problems inherent to the conventional semiconductor devices having the embedded gate-type structure or the serrated gate-type structure, and to provide a semiconductor device having an improved joined structure, which is free from the problems involved in the previously proposed joined structure, as well as a manufacturing method for such a semiconductor device.

A semiconductor device according to the present invention comprises a first semiconductor substrate having a first main surface and a second main surface opposite to the first main surface, recessed portions formed in the first main surface of the first semiconductor substrate, a gate structure including semiconductor regions each having a high impurity-concentration and each formed within respective one of said recessed portions, and a second semiconductor substrate having a first main surface and a second main surface opposite to the first main surface, which first main surface of the second semiconductor substrate being joined to at least the first main surface of the first semiconductor substrate.

A method of manufacturing a semiconductor device according to the present invention comprises the steps of providing a first main surface of a first semiconductor substrate with recessed portions, said first semi-conductor substrate further having a second main surface being opposite to the first main surface, forming a gate structure, within the recessed portions, including semiconductor regions of a high impurity-concentration each formed within the recessed portions, and joining a second semiconductor substrate having a first main surface and a second main surface opposite to the first main surface with the first semiconductor substrate in a manner such that the first main surface of the second semiconductor substrate is in contact with the first main surface of the first semiconductor substrate.

In a preferred embodiment of the semiconductor device according to the present invention, the gate structure is composed of the semiconductor regions each formed in the recessed portions and electrically good-conductive bodies each being substantially completely surrounded by the semiconductor regions. This gate structure is constituted so that each of the recessed portions is completely or partially filled with the gate structure. A semiconductor device of another preferred embodiment of the present invention comprises low-resistance contact regions in joined surfaces of the first and second semiconductor substrates at positions other than the gate structure. These low-resistance contact regions are formed by doping the joined surfaces, except for the gate structure, with impurities. In still another preferred embodiment of the semiconductor device according to the present invention, a semiconductor region having the same conductivity type as that of the gate structure is provided in the first main surface of the second semiconductor substrate in a manner such that the semiconductor region of the second semiconductor substrate is at least in contact with the gate structure formed in the first main surface of the first semiconductor substrate. When the first and second semiconductor substrates are joined to each other, the semiconductor region in the second semiconductor substrate encloses the electrically good-conductive bodies of the gate structure completely together with the semiconductor regions of the gate structure. As a result, a sufficiently high breakdown voltage can be attained between the gate and the cathode. Incidentally, this semiconductor region may preferably be formed in the entire of the first main surface of the second semiconductor substrate.

In a preferred embodiment of the method of manufacturing a semiconductor device according to the present invention, the step of forming the gate structure within the recessed portions in the first main surface of the first semiconductor substrate comprises the sub-steps of forming a semiconductor layer doped with impurities of the opposite conductivity type on the first main surface of the first semiconductor substrate, in which the recessed portions have already been provided, by chemical vapor deposition, and partially removing the semiconductor layer until the first main surface of the semiconductor substrate is exposed. In another preferred embodiment of the method of manufacturing a semiconductor device according to the present invention, the step of forming the gate structure within the recessed portions in the first main surface of the first semiconductor substrate may comprise the sub-steps of forming a first semiconductor layer doped with impurities of the opposite conductivity type on the first main surface of the first semi conductor substrate, in which the recessed portions have already been provided, by chemical vapor deposition, providing electrically good-conductive bodies on the first semiconductor layer within respective recessed portions, forming a second semiconductor layer doped with impurities of the opposite conductivity type on the electrically good-conductive bodies as well as the first semiconductor layer by chemical vapor deposition, and partially removing the first and second semiconductor layers until the first main surface of the semiconductor substrate is exposed. In still another preferred embodiment of the method of manufacturing a semiconductor device according to the present invention, the step of forming the gate structure within the recessed portions in the first main surface of the first semiconductor substrate comprises the sub-steps of forming a first semiconductor layer doped with impurities of the opposite conductivity type on the first main surface of the first semiconductor substrate, in which the recessed portions have already been provided, by chemical vapor deposition, forming an electrically good-conductive film on the first semiconductor layer, forming a second semiconductor layer doped with impurities of the opposite conductivity type on the electrically good-conductive film by chemical vapor deposition, and partially removing the first and second semiconductor layers and the electrically good-conductive film until the first main surface of the semiconductor substrate is exposed. Incidentally, when either one of the joined surfaces of the first and second semiconductor substrates is formed to have a high impurity-concentration in advance, impurities in that surface are thermally diffused into the other one of the joined surfaces after the joining of the two substrates and thus, a better electric contact can be attained between the joined surfaces.

In the present semiconductor device and the method of manufacturing the same, it is not necessary to conduct an epitaxial growth step since the gate regions are formed within respective recessed portions formed in one surface of the first semiconductor substrate and the second semiconductor substrate is subsequently joined thereto. As a result, the thus-obtained semiconductor device has gate regions that are uniformly provided, stable, at a high impurity-concentration. In addition, since the gate structure is arranged within the recessed portions formed in the first main surface of the first semiconductor substrate, the gate regions can have a larger cross sectional area, which brings about a remarkable decrease in the gate resistance. This means that the electric current flowing within the channel can be cut off completely. In the embodiments where the recessed portions are completely filled with the gate structure, the resulting semiconductor device can be improved in the mechanical strength as well as in the cooling efficiency, because no hollow space is left over the gate structure. Furthermore, when a high melting point metal or a poly-silicon having an excellent corrosion resistance is used as the electrically good-conductive body in the gate structure, the semiconductor region can be effectively prevented from being contaminated with impurities and the gate resistance can be significantly reduced.

DESCRIPTION OF THE PREFERRED EMBODIMENTS

Now, preferred embodiments of the present invention will be explained by referring to the attached drawings.

Figure 1:
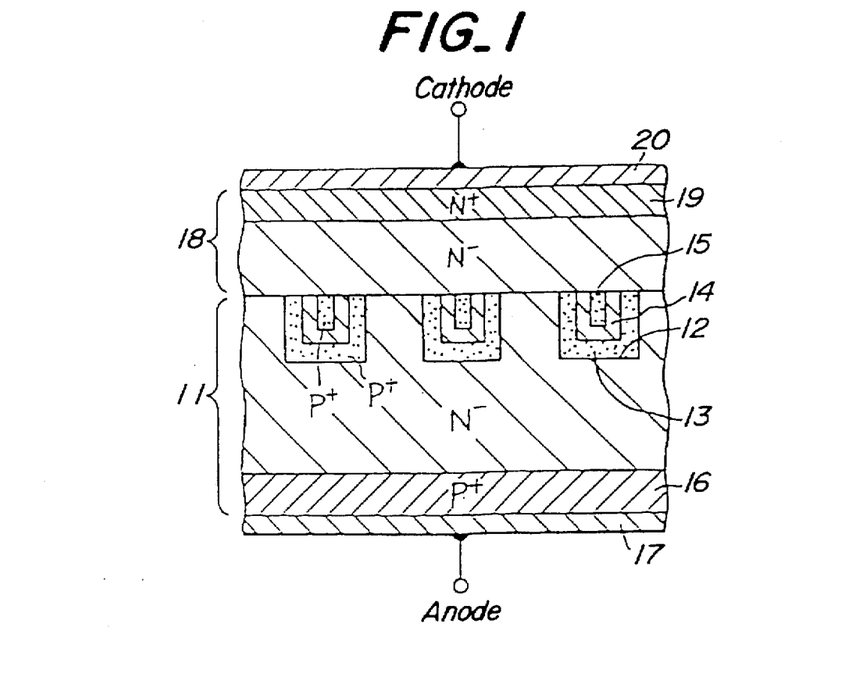
FIG. 1 is a cross sectional view illustrating a structure of a first embodiment of the semiconductor device according to the present invention.

In FIG. 1, there is shown a first embodiment of the semiconductor device according to the present invention. In this embodiment, the semiconductor device is constructed in the form of an SI thyristor. A first main surface of a first semiconductor substrate 11 made of an $N^-$-type silicon is provided with recessed portions 12 by precise machining, and a gate structure is formed within the recessed portions 12. Namely, each recessed portion 12 is filled with a $P^+$-type poly-silicon film 13, a layer 14 of an electrically good-conductive material such as W, Mo, $WSi_2$ or $MoSi_2$, and a $P^+$-type poly-silicon film 15. Since the recessed portion 12 is completely filled with the gate structure in this embodiment, the upper surface of the gate structure is coplanar with the first main surface of the first semiconductor substrate 11. A second main surface of the first silicon substrate 11 is doped with $P^+$-type impurities to form a $P^+$-type anode contact layer 16, and an anode electrode 17 is formed thereon.

In this embodiment, each recessed portion 12 formed in the first main surface of the first semi-conductor substrate 11 is completely filled with the gate structure 13-15, so that the upper surface of each gate structure is aligned with (coplanar with) the first main surface of the first semiconductor substrate 11. A first main surface of a second semiconductor substrate 18 made of an $N^-$-type silicon is then joined to the thus-aligned first main surface of the first semiconductor substrate 11 and upper surfaces of the gate structures 13-15. A second main surface of the second semiconductor substrate 18 is provided with a $N^+$-type cathode region 19, and a cathode electrode 20 is formed thereon.

Although the electrically good-conductive layer 14 is in contact with the first main surface of the second semiconductor substrate 18, an electric current does not directly flow between the gate structure and the second semiconductor substrate 18 because a Schottky junction is obtained therebetween constituting the electrically good-conductive layer 14 of a high melting point metal such as W and Mo, or a silicide of a high melting point metal such as $WSi_2$ and $MoSi_2$.

Figure 2:
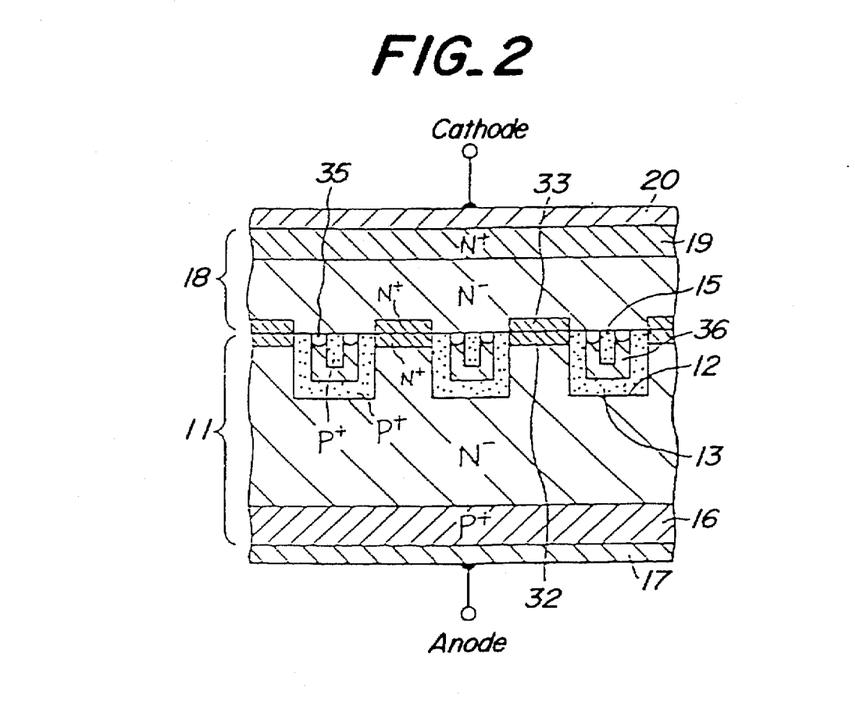
FIG. 2 is a cross sectional view showing a structure of a second embodiment of the semiconductor device according to the present invention.

Now referring to FIG. 2, there is illustrated a structure of a second embodiment of the semiconductor device according to the present invention. In FIG. 2, the same reference numerals as in FIG. 1 are used to denote the same components, and detailed explanations are omitted here. In the first embodiment, the electrically good-conductive layer 14 is formed of such a material that constitutes a Schottky junction with the N⁻-type silicon. On the other hand, in this embodiment, an electrically good-conductive layer 36 is selectively removed in portions which are to be contacted with the first main surface of the second semiconductor substrate 18 to form a hollow space 35 therein. This structure allows the electrically good-conductive layer 36 to be formed of any kind of materials. In other words, there are more choices regarding the material for the electrically good-conductive layer 36 when the semiconductor device is formed according to this structure. In this embodiment, the joined surfaces of the first and second substrates are provided with contact regions 32 and 33, respectively at positions other than the gate structures. Incidentally, the selective removal of the electrically good-conductive layer 36 can be conducted by mechanical polishing or etching.

Figure 3:
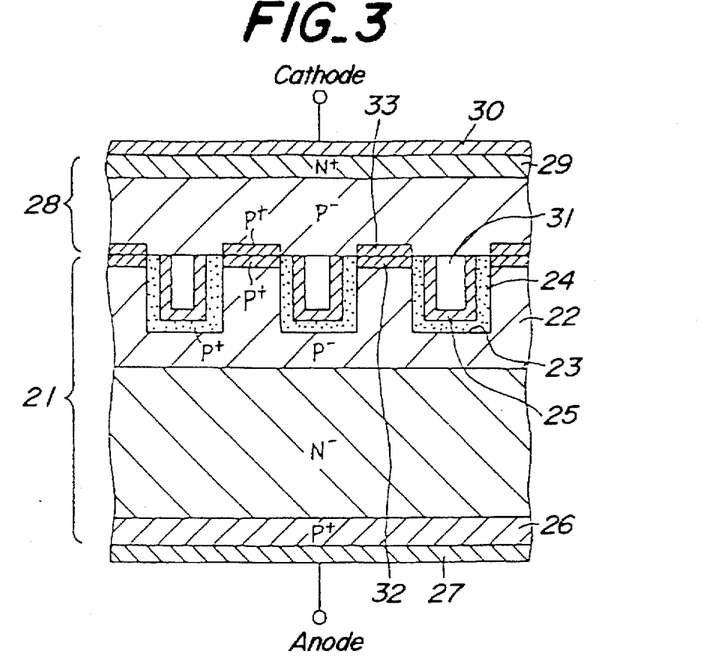
FIG. 3 is a cross sectional view depicting a structure of a third embodiment of the semiconductor device according to the present invention.

A structure of a third embodiment of the semiconductor device according to the present invention is shown in FIG. 3. In this embodiment, the semiconductor device is in the form of a GTO thyristor, and a gate structure is partially formed within each recessed portion 23 provided in a first main surface of a first semiconductor substrate 21. More specifically, a P⁻-type semiconductor region 22 is formed in the first main surface of the first semiconductor substrate 21 composed of an N⁻-type silicon substrate, and then the recessed portions 23 are formed therein. Within each recessed portion 23, a P⁺-type poly-silicon film 24 and an electrically good-conductive layer 25 are successively formed to constitute a gate structure. Since each recessed portion 23 is partially filled with the gate structure 24-25 as mentioned before, a hollow space 31 is left within the recessed portion 23.

A P⁺-type anode region 26 is formed in a second main surface of the first semiconductor substrate 21. Then, a first main surface of a second semiconductor substrate 28, which is composed of a P⁻-type silicon substrate, is brought into contact with the first main surface of the first semiconductor substrate 21. Now, the hollow space 31 exists between the gate structure 24-25 and the first main surface of the second semiconductor substrate 28. An N⁺-type cathode region 29 is formed in the second main surface of the second semiconductor substrate 28, and a cathode electrode 30 is formed thereon. Since the electrically good-conductive layer 25 is formed of a material such as Mo which constitutes a Schottky junction with the P⁻-type silicon of the second substrate 28, there is no problem when the electrically good-conductive layer 25 is in direct contact with the surface of the second semiconductor substrate 28.

Figure 4:
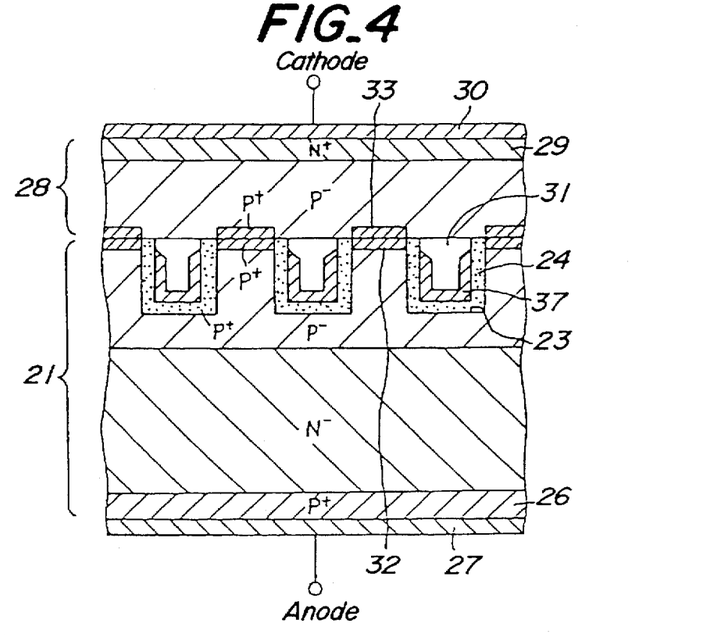
FIG. 4 is a cross sectional view showing a structure of a fourth embodiment of the semiconductor device according to the present invention.

Referring to FIG. 4, there is illustrated a structure of a fourth embodiment of the semiconductor device according to the present invention. In FIG. 4, the same reference numerals as in FIG. 3 are used to denote the same components, and detailed explanations are therefore omitted here. In this embodiment, the upper edges of an electrically good-conductive layer 37 are selectively removed by mechanical polishing or etching so that the electrically good-conductive layer 37 is not brought into contact with the second semiconductor substrate 28 when the first and second semiconductor substrates are joined to each other. Accordingly, the electrically good-conductive layer 37 is not necessarily formed of a high melting point metal such as W and Mo, or a silicide of a high melting point metal such as WSi₂ and MoSi₂ that constitutes a Schottky junction with the P⁻-type silicon of the second substrate 28, thereby having more choices when compared with those of the third embodiment.

Figure 5:
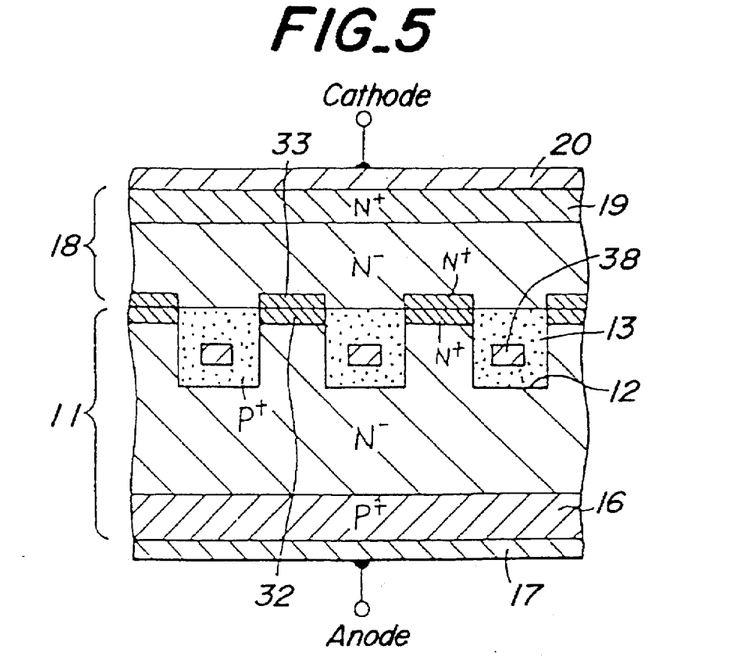
FIG. 5 is a cross sectional view illustrating a structure of a fifth embodiment of the semiconductor device according to the present invention.

In FIG. 5, there is depicted a structure of a fifth embodiment of the semiconductor device according to the present invention. The semiconductor device of this embodiment is in the form of an SI thyristor which is similar to the one in FIG. 1 and thus, the same reference numerals as in FIG. 1 are used to denote the same components. The structure of the SI thyristor of this embodiment is the same as that of the first embodiment except for the gate structure. In the present embodiment, the gate structure including a P⁺-type poly-silicon film 13 and an electrically good-conductive film 38, which is made of W, WSi₂, Mo, MoSi₂ or the like and completely surrounded by the P⁺-type poly-silicon film 13, is provided within each recessed portion 12 formed in a first main surface of a first semiconductor substrate 11. When the gate structure has a structure in which the electrically good-conductive film 38 is completely surrounded by the P⁺-type poly-silicon film 13, a depletion layer extends from substantially the entire circumference of the gate structure during the operation of the device, thereby improving the operating efficiency of the device. Moreover, in contrast with the first embodiment shown in FIG. 1 in which upper edges of the P⁺-type poly-silicon film 13, the electrically good-conductive film 14 and the P⁺-type poly-silicon film 15 are exposed as the upper surface of the gate structure, only the upper surface of the P⁺-type poly-silicon film 13 is exposed as the gate surface in the present embodiment. Therefore, excellent contact is attained between the gate structure and the second semiconductor substrate 18 when the two semiconductor substrates are joined to each other.

Figure 6:
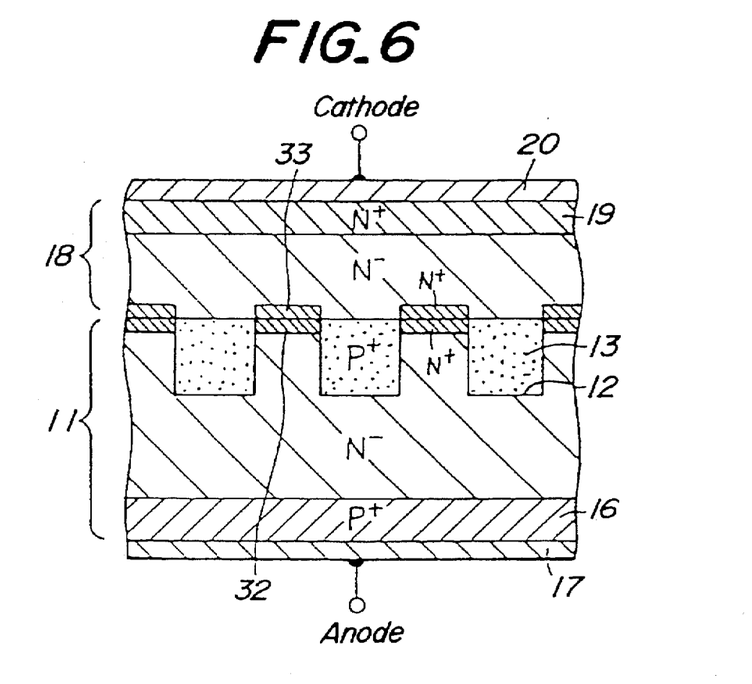
FIG. 6 is a cross sectional view representing a structure of a sixth embodiment of the semiconductor device according to the present invention.

Now referring to FIG. 6, there is illustrated a structure of a sixth embodiment of the semiconductor device according to the present invention. The structure of the semiconductor device of this embodiment is also the same as that of the first embodiment except for the gate structure. Namely, in the present embodiment, the gate structure is constituted by completely filling each recessed portion 12 formed in the first main surface of the first semiconductor substrate 11 with the P⁺-type poly-silicon film 13. As a result, the semiconductor device of this embodiment has not only the same advantages as described in the fifth embodiment shown in FIG. 5, but also the advantage that the gate structure can be produced by a single process, thereby improving the yield of the semiconductor device as a whole.

Figure 7:
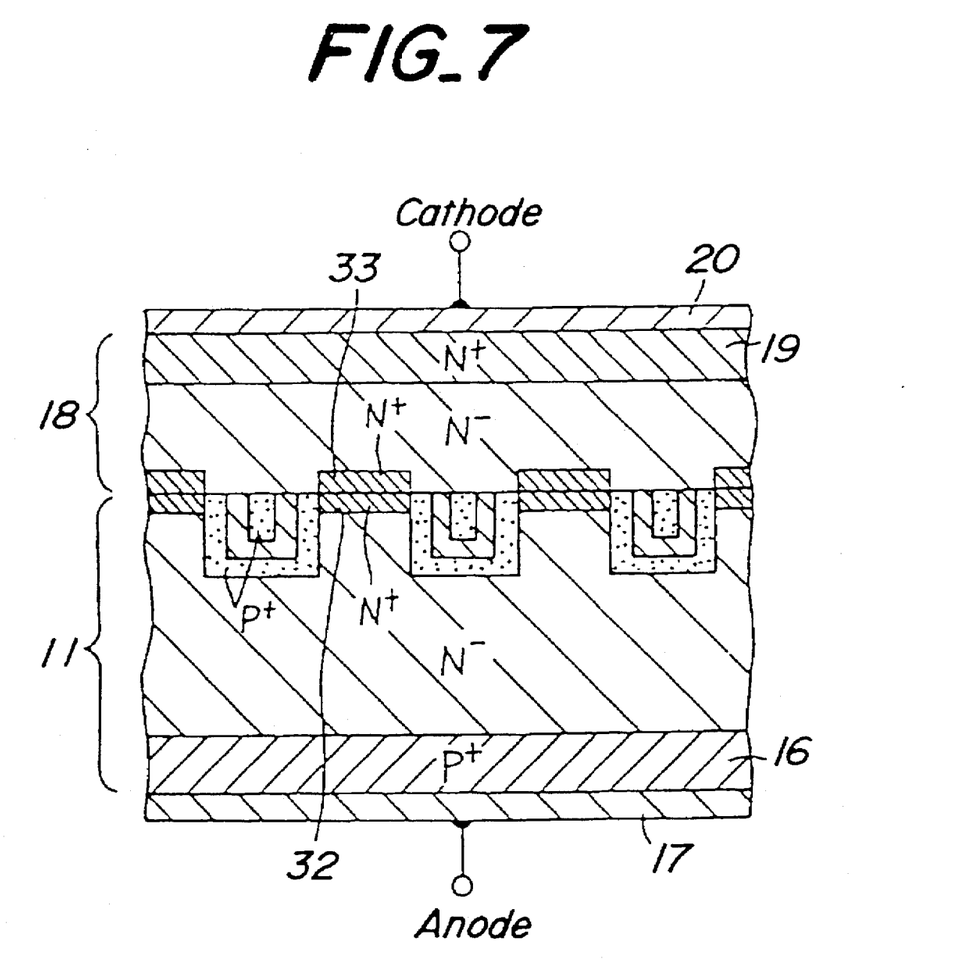
FIG. 7 is a cross sectional view depicting a structure of a seventh embodiment of the semiconductor device according to the present invention.

In FIG. 7, there is shown a structure of a seventh embodiment of the semiconductor device according to the present invention. The semiconductor device of this embodiment has substantially the same structure as that of the first embodiment, except that it further comprises contact regions 32 and 33. The contact regions 32 and 33 are respectively formed in the first main surface of the first semiconductor substrate 11 and the first main surface of the second semiconductor substrate 18, by doping the joined surfaces of the two substrates with a large amount of N-type impurities. When the impurity concentration of the first N⁻-type silicon substrate 11 is set at $10^{12}$–$10^{15}$ atom/cm³, the impurity concentration of the contact regions 32 and 33 can be set at $10^{15}$–$10^{20}$ atom/cm³ or higher. By providing the contact regions 32 and 33 having a high impurity-concentration in the joined surfaces of the first and second semiconductor substrate 11 and 18, a low-resistance ohmic contact is obtained therein. As a result, the probability of tunneling is increased, and a uniform current distribution can be obtained when the device is viewed in a plane perpendicular to the plane of FIG. 7. This results in an overall reduced risk of breakage for the device.

Figure 8A:
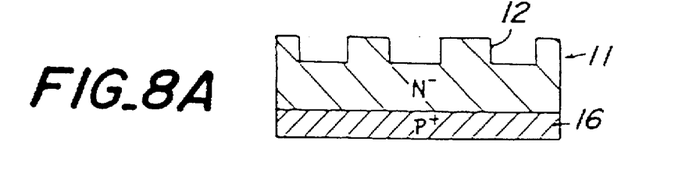
FIGS. 8A–8F are cross sectional views illustrating successive steps of a first embodiment of the manufacturing method of a semiconductor device according to the present invention.

FIGS. 8A–8F are sectional views illustrating successive steps of a manufacturing process for the semiconductor device according to the present invention which is shown in FIG. 1. First of all, as shown in FIG. 8A, a second main surface of a N⁻-type silicon substrate 11 is doped with P-type impurities to form a P⁺-type anode region 16 and then, recessed portions 12 are formed in a first main surface of the substrate 11 by etching. Each recessed portion 12 has a depth of 10 μm or more, a width of 20–50 μm and a pitch of 70 μm. Recessed portions 12 having such dimensions can be easily formed by using the latest techniques of precise machining.

Figure 8B:
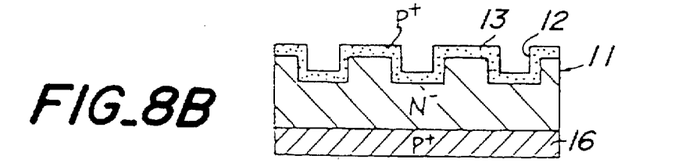

Then, as illustrated in FIG. 8B, a P⁺-type poly-silicon film 13 having a thickness of about 2–3 μm is formed on the first main surface of the semiconductor substrate 11, which has already been provided with the recessed portions 12, by chemical vapor deposition (CVD). The CVD of the poly-silicon film 13 may be conducted using $SiH_4+B_2H_6+H_2$ gas, while heating the silicon wafer 11 at 500–700° C. at a film-forming pressure of 1–10 Torr. After a subsequent thirty-minute annealing at 1000° C. in a nitrogen atmosphere, there is obtained the poly-silicon film 13 having an impurity (boron) concentration of $10^{18}–10^{21}$ atom/cm² and a resistivity of $10^{-1}–10^{-3}$ Ω cm.

Figure 8C:
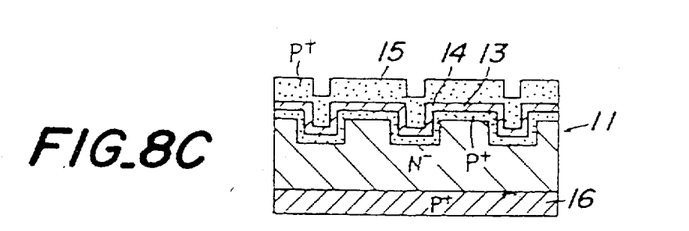

Next, as depicted in FIG. 8C, an electrically good-conductive film 14 having a thickness of about 1 μm is formed on the poly-silicon film 13 by CVD or spattering. A high melting point metal such as W and Mo as well as a silicide of a high melting point metal such as $WSi_2$ and $MoSi_2$ are preferably used as a material for this electrically good-conductive film 14. For example, when W is used as the material for the electrically good-conductive film 14, CVD may be conducted at a reduced pressure with use of $WF_6$ gas while heating the silicon wafer at 300–700° C. In the case of $WSi_2$, CVD may be conducted using $WF_6+SiH_4$ gas at a reduced pressure of 0.2 Torr while heating the silicon wafer at 300–450° C. When Mo is used for the electrically good-conductive film 14, reduced-pressure CVD may be conducted with use of $MoCl_5$ gas while heating the silicon wafer at 400–1350° C. In the case of $MoSi_2$, CVD may be conducted using $MoCl_5+SiH_4$ gas at a reduced pressure of 0.6–2 Torr while heating the silicon wafer at 500–800° C.

Then, a P⁺-type poly-silicon film 15 is formed on the above-obtained electrically good-conductive film 14 by chemical vapor deposition. This poly-silicon film 15 is formed to have a thickness that completely fills the recessed portion 12, typically within a range of about 10–30 μm. This poly-silicon film 15 can be formed under the same conditions as those for the poly-silicon film 13.

Figure 8D:
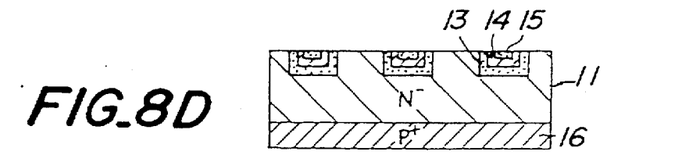
Figure 8E:
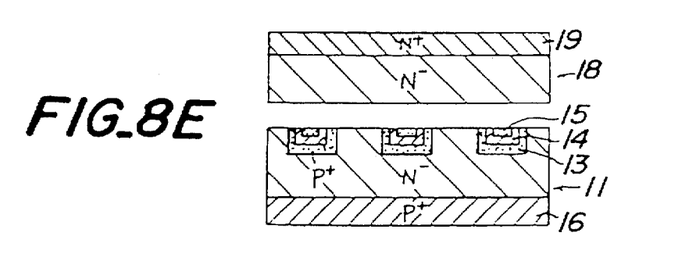
Figure 8F:
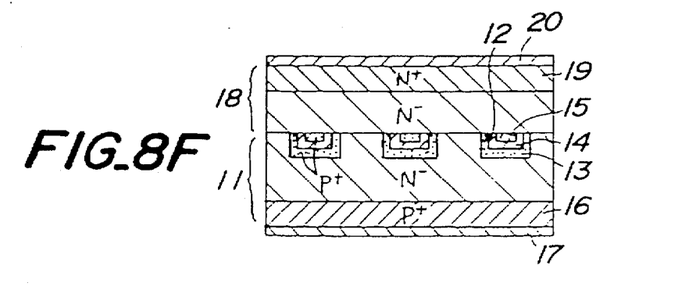

As shown in FIG. 8D, the poly-silicon film 15 and the electrically good-conductive film 14 are then partially removed by polishing or etching-back treatment to expose the first main surface of the semiconductor substrate 11. Accordingly, each recessed portion 12 is completely filled with the gate structure, which is composed of the poly-silicon film 13, the electrically good-conductive film 14, and the poly-silicon film 15, and the upper surface of each gate structure becomes coplanar with the first main surface of the semiconductor substrate 11. Next, as illustrated in FIG. 8E, a second semiconductor substrate 18 having an N⁺-type cathode region 19 in a second main surface is prepared, and brought into contact with the first semiconductor substrate 11 so that the first main surfaces of the first and second substrates are joined to each other. This joining process may be conducted by heating the first and second semiconductor substrates 11 and 18, which are in a contacted state, at a temperature within a range of 400–1100° C., preferably at a temperature within a range of 400–800° C., for several minutes to several hours without applying any additional pressure. Finally, an anode electrode 17 and a cathode electrode 20 are formed on the second main surface of the first semiconductor substrate 11 and the second main surface of the second semiconductor substrate 18, respectively as depicted in FIG. 8F, thereby obtaining the desired SI thyristor.

As described above, the first and second semiconductor substrates are joined to each other in the manufacturing method of the SI thyristor according to the present invention. Since the joining process can be accomplished by less complicated facilities in less time when compared with the conventional epitaxial growth process, an improvement in the yield of the SI thyristor is attained. In addition, characteristics of the device can be stable because the joining process does not have a substrate dependency which has caused problems in the case of epitaxial growth. Furthermore, since a high impurity-concentration region can be provided within the gate structure, the carrier drawing can be conducted at a high speed, thereby enabling the device to have a high frequency property.

Figure 9A:
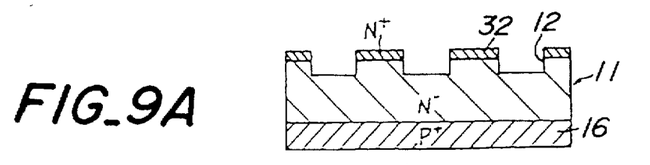
FIGS. 9A–9F are cross sectional views depicting successive steps of a second embodiment of the semiconductor device manufacturing method according to the present invention.
Figure 9B:
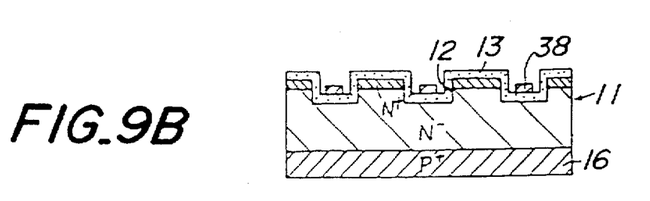
Figure 9C:
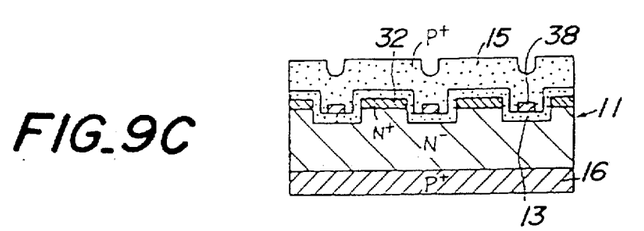

FIGS. 9A–9F are sectional views representing successive steps of another manufacturing method according to the present invention, by which the SI thyristor shown in FIG. 5 is produced. FIGS. 9A and 9B illustrate substantially the same processes as shown in FIGS. 8A and 8B. Namely, a P⁺-type anode region 16 is provided in a second main surface of an N⁻-type silicon substrate 11 by impurity diffusion, and a P⁺-type poly-silicon film 13 is formed on a first main surface of the first semiconductor substrate 11 by CVD after the formation of recessed portions 12. In this embodiment, however, an N⁺-type contact region 32 is formed in advance in the first main surface of the first semiconductor substrate 11 by impurity diffusion. After locally forming an electrically good-conductive film 38 on the poly-silicon film 13 provided within each recessed portion 12, a P⁺-type poly-silicon film 15 is deposited thereon by CVD so that the recessed portions 12 are completely filled with the poly-silicon film 15 as illustrated in FIG. 9C.

Figure 9D:
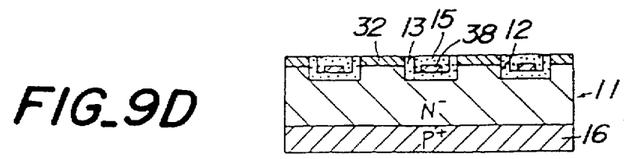
Figure 9E:
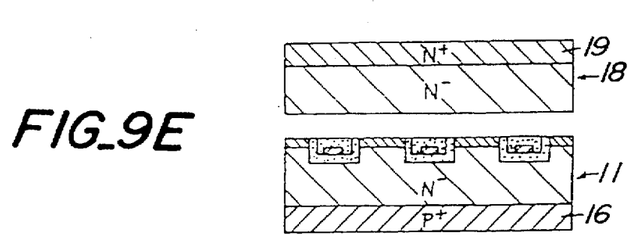
Figure 9F:
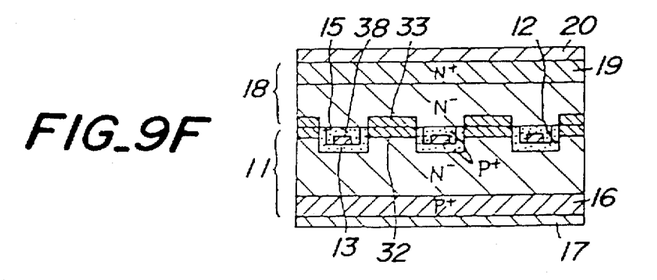

Then, as depicted in FIG. 9D, the poly-silicon films 13 and 15 are partially removed by polishing or etching-back treatment to expose the first main surface of the first semiconductor substrate 11. The subsequent processes are similar to those of the preceding embodiment. Namely, after joining a second semiconductor substrate 18 provided with an N⁺-type cathode region 19 to the first semiconductor substrate 11 as shown in FIG. 9E, an anode electrode 17 and a cathode electrode 20 are formed on the second main surfaces of the first and second semiconductor substrates 11 and 18, respectively as shown in FIG. 9F. Incidentally, due to the thermal treatment during the joining process, N-type impurities in the contact regions 32 are diffused into corresponding portions of the first main surface of the second semiconductor substrate 18, thereby forming contact regions 33.

Figure 10A:
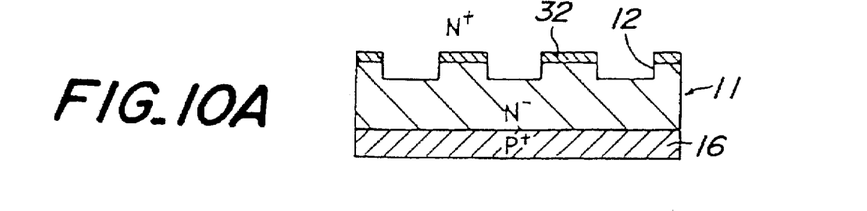
FIGS. 10A–10E are cross sectional views representing successive steps of a third embodiment of the manufacturing method of a semiconductor device according to the present invention.
Figure 10B:
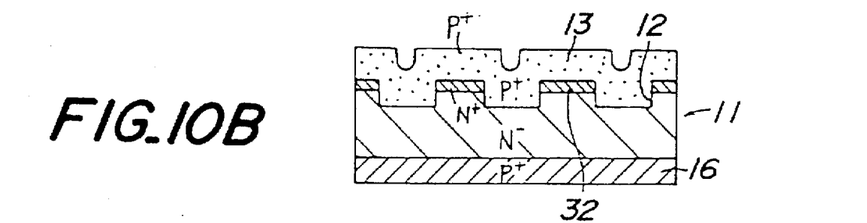
Figure 10C:
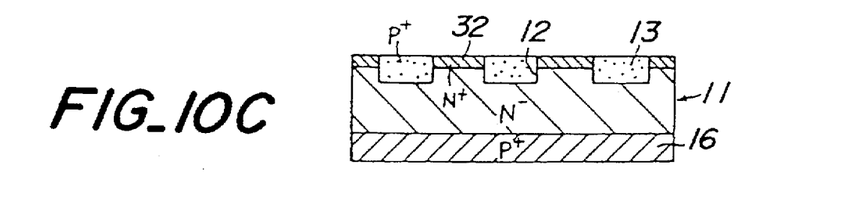

FIGS. 10A–10F are sectional views illustrating successive steps of a manufacturing method according to the present invention, wherein the semiconductor device shown in FIG. 6 is produced. In this case, as shown in FIG. 10A, a first main surface of a first semiconductor substrate 11 is doped with N-type impurities to form an N⁺-type contact region 32, while doping a second main surface of the substrate 11 with P-type impurities to form a P⁺-type anode region 16. After providing recessed portions 12, a P⁺-type poly-silicon film 13 is formed on the first main surface of the first semiconductor substrate 11 by CVD as depicted in FIG. 10B. This poly-silicon film 13 is formed in a manner such that each recessed portion 12 is completely filled with the film, and thus may have a thickness of 10 μm or more. Next, the poly-silicon film 13 is partially removed by mechanical polishing or by etching to expose the first main surface of the first semiconductor substrate 11.

Figure 10D:
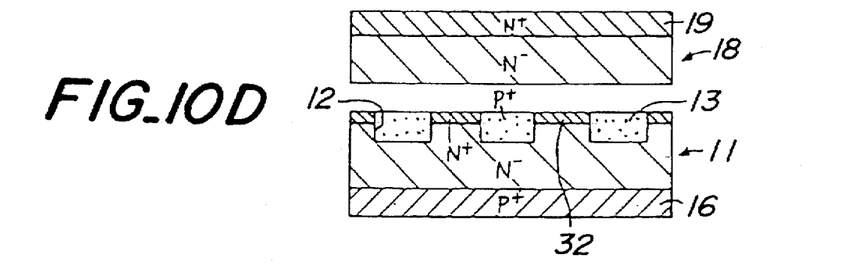
Figure 10E:
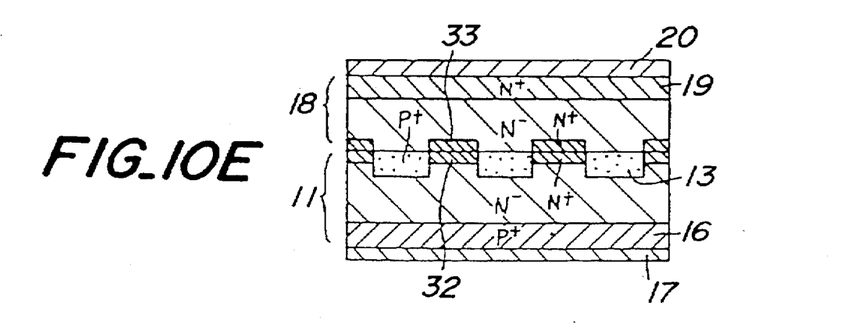

Then, as illustrated in FIG. 10D, a first main surface of a second semiconductor substrate 18, which has an N⁺-type cathode region 19 in a second main surface, is brought into contact with the first main surface of the first semiconductor substrate 11, and the two semiconductor substrates are heated to be joined to each other. This heat-joining process is conducted under the same conditions as those in the preceding embodiments. Finally, as depicted in FIG. 10E, an anode electrode 17 and a cathode electrode 20 are formed on the second main surface of the first semiconductor substrate 11 and the second main surface of the second semiconductor substrate 18, respectively.

Figure 11:
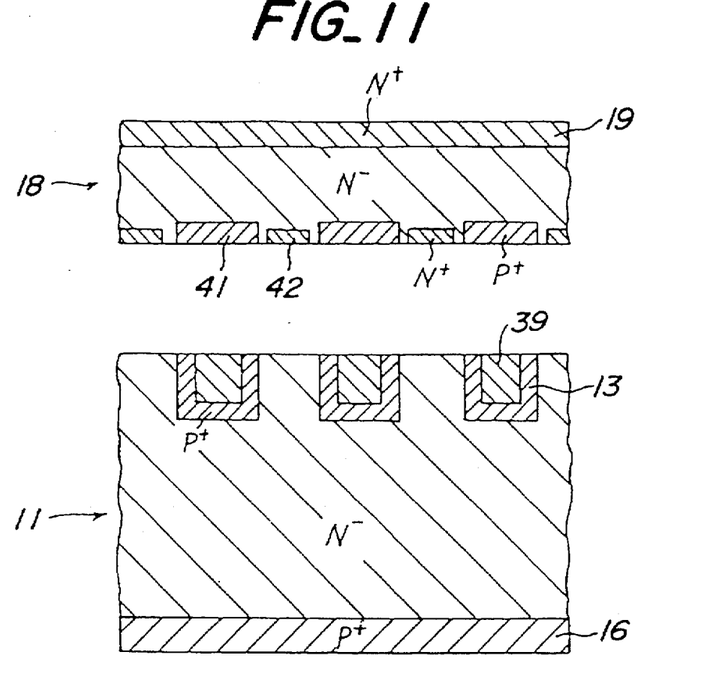
FIG. 11 is a cross sectional view illustrating a structure of an eighth embodiment of the semiconductor device according to the present invention, and showing a state before joining.
Figure 12:
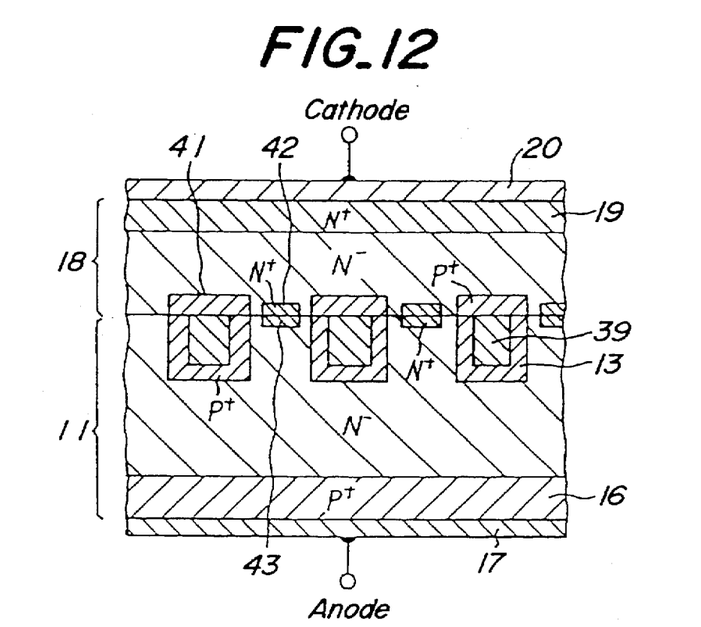
FIG. 12 is a cross sectional view showing the structure of the eighth embodiment of the semiconductor device according to the present invention, and showing a state after joining.

FIGS. 11 and 12 show an eighth embodiment of the semiconductor device according to the present invention. The semiconductor device is formed as an SI thyristor in this embodiment, and a first and second silicon substrates of the device, which are in a state before joining, are illustrated in FIG. 11.

If a gate metal constituting a part of a gate structure is brought into contact with a second semiconductor substrate, there cannot be obtained a high breakdown voltage between the gate and a cathode. For this reason, the gate electrode of the first embodiment shown in FIG. 1 is made of from a metal that constitutes a Schottky barrier with respect to the second semiconductor substrate; and, in the second embodiment depicted in FIG. 2, the hollow space 35 is formed above the gate metal to prevent the gate electrode from being directly contacted with the second semiconductor substrate. This means that there is a limitation on potential materials usable for the gate electrode in the first embodiment, and that there is a risk of decreasing the yield in the second embodiment because the formation of the hollow space 35 is difficult thereby making the manufacturing process significantly complicated.

In the present embodiment, for the purpose of solving these drawbacks, P⁺-type regions 41 are formed in a first main surface of the second semiconductor substrate 18 at positions corresponding to the gate structures of the first semiconductor substrate 11 as shown in FIG. 11. These P⁺-type regions 41 can be formed by impurity diffusion, and may respectively have a thickness of about 0.3-2 μm. In each recessed portion formed in the first main surface of the first semiconductor substrate 11, a P⁺-type poly-silicon film 13 is formed first, and an electrically good-conductive film 39 is provided thereon so that the recessed portion is completely filled with these films. A width of the upper surface of each recessed portion may be set at 30–100 μm, and a distance between adjoining recessed portions may be within a range of 10–20 μm. Further, portions of the first main surface of the second silicon substrate 18 laying between the P⁺-type regions 41 are doped with a large amount of N-type impurities to form contact regions 42. A distance between a lateral edge of one P⁺-type region 41 and that of the adjoining contact region 42 may be set at about 1–2 μm.

The first silicon substrate 11 and the second silicon substrate 18 are joined to each other in a manner such that the gate structures are brought into contact with the above-described P⁺-type regions 41. Accordingly, each electrically good-conductive film 39 is completely surrounded by P⁺-type semiconductor regions as shown in FIG. 12. Incidentally, due to the thermal treatment during or after the joining process, N-type impurities in the N⁺-type contact region 42 of the second silicon substrate 18 are diffused into corresponding portions of the first main surface of the first silicon substrate 11, thereby forming N⁺-type contact regions 43. Although the structure of the semiconductor device in this embodiment is similar to that of the fifth embodiment, the manufacturing procedure thereof is different from that of the fifth embodiment.

Figure 13:
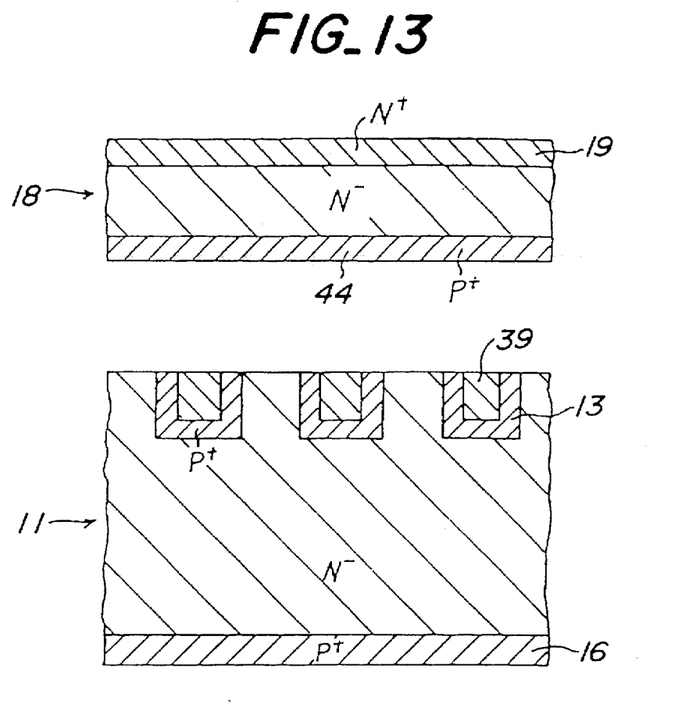
FIG. 13 is a cross sectional view illustrating a structure of a ninth embodiment of the semiconductor device according to the present invention, and showing a state before joining.
Figure 14:
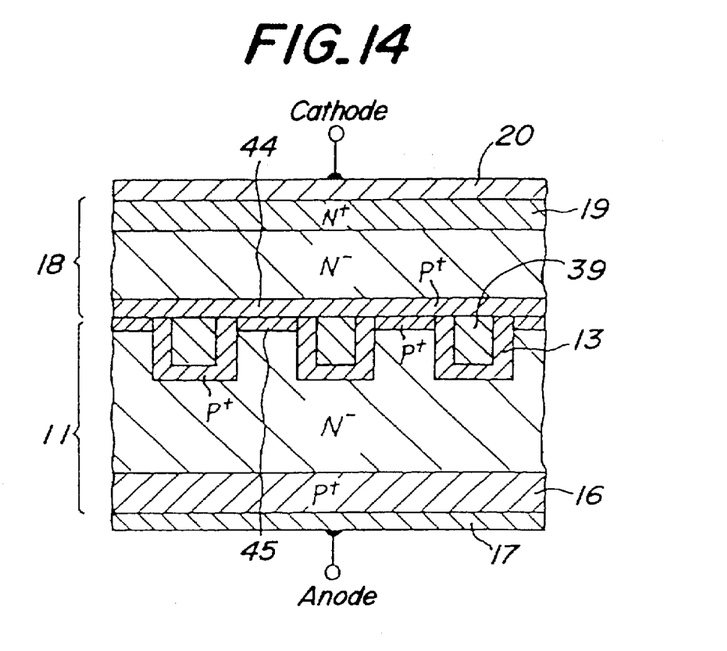
FIG. 14 is a cross sectional view depicting the structure of the ninth embodiment of the semiconductor device according to the present invention, and showing a state after joining.

A ninth embodiment of the semiconductor device according to the present invention is illustrated in FIGS. 13 and 14. In this embodiment, a P⁺-type region 44 is formed all over a first main surface of a second silicon substrate 18 by diffusing boron thereinto as shown in FIG. 13. This P⁺-type region 44 comes into contact with gate structures formed in a first main surface of a first silicon substrate 11 when the two silicon substrates 11 and 18 are joined to each other as depicted in FIG. 14. In this case, since the P-type impurities of the P⁺-type region 44 are diffused into the first main surface of the first semiconductor substrate 11 due to the thermal treatment during or after the joining process, P⁺-type contact regions 45 are formed in the first main surface of the first semiconductor substrate 11.

In this embodiment, the positioning of the first and second silicon substrates during the joining process is easier than that of the eighth embodiment, because the P⁺-type region 44 is formed in the entire surface of the first main surface of the second silicon substrate 18.

Furthermore, since a PN junction is formed between the gate and cathode of the present device, an electric current does not flow between the anode and cathode unless a bias voltage is applied between the gate and cathode. When a bias voltage is applied between the gate and cathode and a depletion layer extends as far as the PN junction, an electric current flows between the anode and cathode. This means that the semiconductor device of the present invention is a normally-off type SI thyristor.

Figure 15:
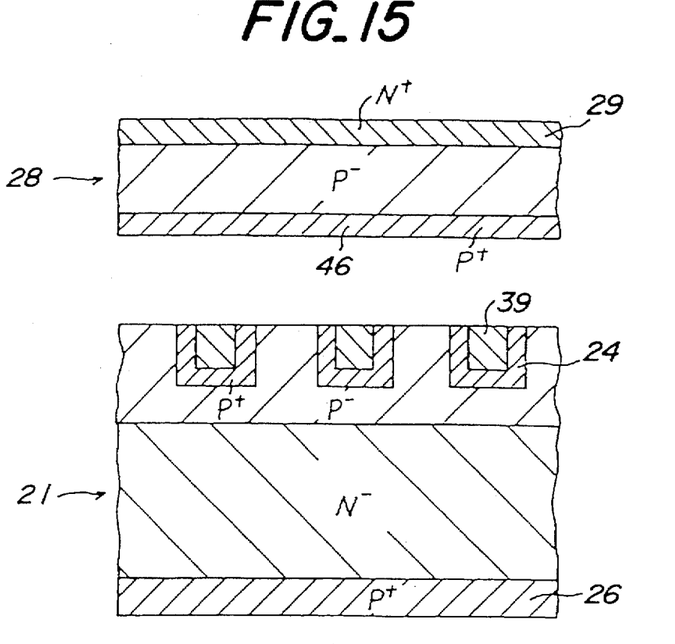
FIG. 15 is a cross sectional view representing a structure of a tenth embodiment of the semiconductor device according to the present invention, and showing a state before joining.
Figure 16:
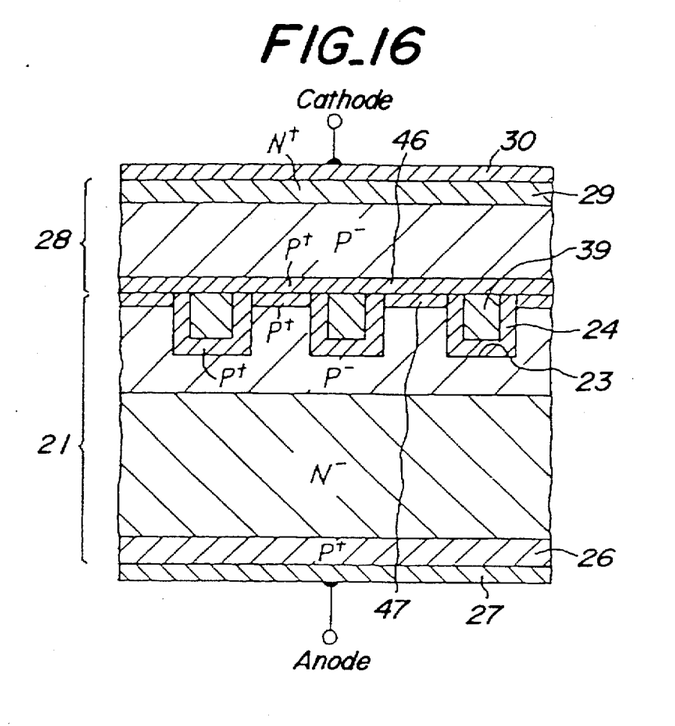
FIG. 16 is a cross sectional view showing the structure of the tenth embodiment of the semiconductor device according to the present invention, and showing a state after joining.

In FIGS. 15 and 16, there is shown a structure of a tenth embodiment of the semiconductor device according to the present invention. Although a second semiconductor substrate 28 is composed of a P⁻-type silicon substrate and an N⁺-type cathode region 29 is formed in a second main surface thereof in order to form the device of the present invention as a GTO thyristor, the structure of this thyristor is essentially the same as that of the ninth embodiment. Namely, a P⁺-type region 46 is formed in the entire surface of a first main surface of the second silicon substrate 28 by diffusing boron thereinto, and this P⁺-type region 46 is brought into contact with a first main surface of a first silicon substrate 21. Also in this case, boron in the P⁺-type region 46 is diffused into the first main surface of the first silicon substrate 21 due to the thermal treatment conducted after the joining of the two substrates, so that there are formed P⁺-type contact regions 47 in the first main surface of the first silicon substrate 21, thereby attaining an electrically good contact between the two substrates. In addition, since the P⁺-type region 46 is formed in the entire surface of the first main surface of the second silicon substrate 28 also in this embodiment, the positioning during the joining process can be accomplished without difficulty. Moreover, since the electrically good-conductive film 39 constituting a part of the gate structure is not directly in contact with the second silicon substrate 28, not only can a sufficiently high breakdown voltage between the gate and the cathode be attained, but an efficient drawing of gate current can also be attained. As a result, the switching speed is increased in the present semiconductor device.

The present invention is not restricted to the embodiments described above, and various changes and modifications can be made on those embodiments. For example, although semiconductor devices in a form of an SI thyristor or a GTO thyristor have been explained in the above-described embodiments, the semiconductor device according to the present invention can be formed as either an SI transistor or an IGBT. Although the first and second semiconductor substrates are heated to be joined to each other in the above embodiments, the two silicon substrates can be joined to each other simply by bringing them into contact with each other. Furthermore, the structures shown in FIGS. 3 and 4, in which each recessed portion is partially filled with the gate structure, can be applied to an SI thyristor.

In the semiconductor device according to the present invention, a low-resistance material can be used in the gate structure, so that the gate resistance is decreased correspondingly. Especially, when an electrically good-conductive film is used therein, there can be obtained a significant decrease in the gate resistance. Accordingly, the drawing of carriers at the time when the electric current is cut off can be conducted at a higher speed, thereby increasing the maximum cutoff current as well as obtaining a high frequency property. Also, when the semiconductor device of the present invention has a structure, in which each recessed portion provided in the first main surface of the first semiconductor substrate is completely filled with the gate structure, the gate region is hardly contaminated, thereby preventing deteriorations of device properties. This structure also improves the cooling efficiency of the device. In addition, since the present manufacturing method does not require epitaxial growth, which is an essential step in the conventional method, the yield of the process is improved, resulting in an increase of the throughput which leads to a decrease in the production cost. In the case where a high impurity-concentration contact region having the same conductivity type as that of the gate structure is provided in the first main surface of the second semiconductor substrate, the electrically good-conductive film in the gate structure does not come into direct contact with the second semiconductor substrate even when the two substrates are joined to each other. Accordingly, a sufficiently high breakdown voltage can be attained between the gate and the cathode. Particularly when this high impurity-concentration region is provided all over the first main surface of the second semiconductor substrate, the positioning of the first and second substrates during the joining process is simplified.

I claim:

1. A semiconductor device comprising:
   a first semiconductor substrate having a first main surface and a second main surface opposite to the first main surface;
   recessed portions formed in the first main surface of the first semiconductor substrate;
   a gate structure including semiconductor regions each having a high impurity-concentration and each formed entirely within said recessed portions, such that the gate structure is wholly contained within said recessed portions of the first semiconductor substrate; and
   a second semiconductor substrate having a first main surface and a second main surface opposite to the first main surface, the first main surface of the second semiconductor substrate being joined to at least the first main surface of the first semiconductor substrate.

2. The semiconductor device according to claim 1, wherein said gate structure further includes electrically good-conductive bodies each being corresponding to respective one of said semiconductor regions.

3. The semiconductor device according to claim 2, wherein each of said electrically good-conductive bodies is surrounded by respective one of said semiconductor regions.

4. The semiconductor device according to claim 2, wherein each of said electrically good-conductive bodies is provided on a surface of respective one of said semiconductor regions.

5. A semiconductor device comprising:
   a first semiconductor substrate having a first main surface and a second main surface opposite to the first main surface;
   recessed portions formed in the first main surface of the first semiconductor substrate;
   a gate structure including (i) semiconductor regions each having a high impurity-concentration and each formed within respective recessed portions, and (ii) electrically good-conductive bodies each corresponding to respective semiconductor regions; and
   a second semiconductor substrate having a first main surface and a second main surface opposite to the first main surface, the first main surface of the second semiconductor substrate being joined to at least the first main surface of the first semiconductor substrate,
   wherein said electrically good-conductive bodies are made of such a material that constitutes a Schottky junction with said second semiconductor substrate, and are arranged such that end portions thereof are brought into contact with said first surface of the second semiconductor substrate.

6. The semiconductor device according to claim 1, wherein said recessed portions formed in said first main surface of said first semiconductor substrate are completely filled with said gate structure.

7. The semiconductor device according to claim 6, wherein said first main surface of said second semiconductor substrate is joined to said first main surface of said first semiconductor substrate and an upper surface of said gate structure.

8. The semiconductor device according to claim 7, wherein a semiconductor region having the same conductivity type as that of said semiconductor regions of said gate structure is provided in said first main surface of said second semiconductor substrate such that said semiconductor region of said second semiconductor substrate is in contact with at least said gate structure formed in said first main surface of said first semiconductor substrate.

9. The semiconductor device according to claim 8, wherein said semiconductor region having the same conductivity type as that of said semiconductor regions of said gate structure is provided in an entire first main surface of said second semiconductor substrate.

10. A semiconductor device comprising:
    a first semiconductor substrate having a first main surface and a second main surface opposite to the first main surface;
    recessed portions formed in the first main surface of the first semiconductor substrate;
    a gate structure including semiconductor regions each having a high impurity-concentration and each formed within respective recessed portions; and
    a second semiconductor substrate having a first main surface and a second main surface opposite to the first main surface, the first main surface of the second semiconductor substrate being joined to at least the first main surface of the first semiconductor substrate,
    wherein the recessed portions formed in the first main surface of the first semiconductor substrate are partially filled with the gate structure while leaving a space between the gate structure and the first main surface of the second semiconductor substrate.

11. The semiconductor device according to claim 1, wherein a low-resistance contact region is provided in joined surfaces of said first and second semiconductor substrates at a position other than said gate structure.

12. A semiconductor device comprising:

a first semiconductor substrate having a first main surface and a second main surface opposite to the first main surface;

recessed portions formed in the first main surface of the first semiconductor substrate;

a gate structure including semiconductor regions each having a high impurity concentration and each formed within said recessed portions and further comprising electrically good-conductive bodies, said bodies comprising metal and each corresponding to respective semiconductor regions of the gate structure; and a second semiconductor substrate having a first main surface and a second main surface opposite to the first main surface, said first main surface of the second semiconductor substrate being joined to at least the first main surface of the first semiconductor substrate, whereby each of said semiconductor regions of the gate structure is surrounded by semiconductor regions of said first and second semiconductor substrates.

13. A semiconductor device according to claim 12, wherein said semiconductor regions of the gate structure have one conductivity type and said semiconductor regions surrounding the semiconductor regions of the gate structure have an opposite conductivity type.

14. A semiconductor device according to claim 12, wherein said semiconductor regions of the gate structure have one conductivity type and said semiconductor regions surrounding the semiconductor regions of the gate structure also have said one conductivity type, but have an impurity concentration lower than that of the semiconductor regions of the gate structure.

* * * * *